United States Patent
Guitton et al.

(10) Patent No.: US 8,581,676 B2
(45) Date of Patent: Nov. 12, 2013

(54) COMMON-MODE FILTER

(75) Inventors: Fabrice Guitton, Monnaie (FR); Benjamin Thon, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 546 days.

(21) Appl. No.: 12/770,009

(22) Filed: Apr. 29, 2010

(65) Prior Publication Data

US 2010/0277254 A1 Nov. 4, 2010

(30) Foreign Application Priority Data

Apr. 30, 2009 (FR) ...................................... 09 52870

(51) Int. Cl.
*H03H 7/00* (2006.01)

(52) U.S. Cl.
USPC ........................................... 333/177; 333/181

(58) Field of Classification Search
USPC .......... 336/182; 333/167, 168, 174, 202–205, 333/177, 181
See application file for complete search history.

(56) References Cited

U.S. PATENT DOCUMENTS

| | | | |
|---|---|---|---|
| 5,142,430 | A | 8/1992 | Anthony |
| 6,218,913 | B1 | 4/2001 | Pagenkopf |
| 6,529,750 | B1 | 3/2003 | Zhang et al. |
| 7,612,629 | B2 | 11/2009 | Pepper |
| 2006/0049890 | A1* | 3/2006 | Wasaki et al. ................... 333/12 |
| 2007/0188265 | A1 | 8/2007 | Perreault et al. |
| 2007/0252664 | A1 | 11/2007 | Saitoh et al. |
| 2009/0309686 | A1* | 12/2009 | Espino ........................ 336/182 |
| 2010/0277256 | A1 | 11/2010 | Concord |

FOREIGN PATENT DOCUMENTS

JP 2270414 A 11/1990

OTHER PUBLICATIONS

French Search Report dated Feb. 8, 2010 from corresponding French Application No. 09/52870.

* cited by examiner

*Primary Examiner* — Benny Lee
*Assistant Examiner* — Gerald Stevens

(57) ABSTRACT

A common-mode filter including two input terminals and two output terminals and, in series between each input or output terminal and the ground, a capacitive element and a first inductive element.

13 Claims, 2 Drawing Sheets

COMMON-MODE FILTER

CROSS REFERENCE TO RELATED APPLICATIONS

This application claims the priority benefit of French patent application number 09/52870, filed on Apr. 30, 2009, entitled "COMMON-MODE FILTER," which is hereby incorporated by reference to the maximum extent allowable by law.

BACKGROUND OF THE INVENTION

1. Field of the Invention

The present invention generally relates to electronic circuits, and more specifically to common-mode filters used in such circuits.

2. Discussion of the Related Art

FIG. 1 is a block diagram of an electronic board 1 comprising, in addition to one or several circuits 12 capable of providing differential signals, at least one common-mode filter 2 (CMF) of the type to which the present invention applies. Such a filter comprises two input terminals 22 and 24 and two output terminals 26 and 28. The input terminals are intended to receive the differential signals to be processed, the filtered result of which is output.

As illustrated by the examples of signal curves in FIG. 1, the function of a common-mode filter is to let through the differential signals which are in phase opposition and to attenuate or cut the common-mode signals and noise which are in phase on the two inputs. An ideal common-mode filter is a short-circuit for signals in phase opposition at the input and an open circuit for signals in phase. In practice, the filter always lets through low frequencies, and thus a bias level common to the two differential signals.

Common-mode filters are generally used for differential data accesses in digital processing circuits, especially if the frequency of the useful signals is in the same range as the frequency of the signals which are desired to be rejected.

Common-mode filters can also be found in analog circuits, for example, to process signals in differential microphones, where the signal is transmitted symmetrically.

FIG. 2 shows an example of a usual common-mode filter 3. Such a filter is formed of two inductances 31 and 33 respectively connecting input and output accesses 32 and 36 and input and output accesses 34 and 38. The inductances are coupled by a magnetic material 35. The respective phase points of inductances 31 and 33 are on the same side (in the example, on the side of input terminals 32 and 33) to avoid filtering signals in phase opposition.

The operating principle of filter 3 of FIG. 2 is to exhibit a high series impedance for signals in phase and a low series impedance for signals in phase opposition.

The use of a magnetic material 35 is linked to the need to have high inductances having a high series impedance in common mode, without the size of the filter becoming too large. A magnetic material enables obtaining high inductances with a small number of turns, and thus a low series resistance.

This solution is thus limited to applications in which such a metallic material can be used. In particular, this may not be possible when common-mode filters are desired to be integrated, especially on glass substrates.

A disadvantage linked to the use of a magnetic material is a saturation in the presence of a high magnetic field.

Further, the use of a magnetic material is particularly expensive.

A common-mode filter without magnetic material is thus desireable.

SUMMARY OF THE INVENTION

At least one embodiment of the present invention aims at overcoming all or part of the disadvantages of usual common-mode filters.

An embodiment of the present invention more specifically aims at avoiding the use of a magnetic material in a common-mode filter.

Another object of an embodiment of the present invention is to avoid increasing the series resistance by the presence of the common-mode filter in an electronic circuit.

Another object of an embodiment of the present invention is to provide a solution which can be easily integrated, especially on glass substrates.

To achieve all or part of these and other objects, at least one embodiment of the present invention provides a common-mode filter comprising two input terminals and two output terminals and, in series between each input or output terminal and the ground, a capacitive element and a first inductive element.

According to an embodiment of the present invention, the first inductive element is common to all capacitive elements.

According to an embodiment of the present invention, a first input terminal is directly connected or is common to a first output terminal, and a second input terminal is directly connected or is common to a second output terminal.

According to an embodiment of the present invention, a first input terminal is connected to a first output terminal by a second inductive element, and a second input terminal is connected to a second output terminal by a third inductive element.

According to an embodiment of the present invention, the second and third inductive elements are coupled.

According to an embodiment of the present invention:
the input terminals are connected by two capacitive elements in series;
the output terminals are connected by two other capacitive elements in series, the midpoints of the respective series connections of the capacitive elements being interconnected to a first terminal of the first inductive element, the other terminal of which is grounded.

According to an embodiment of the present invention, the capacitive elements are formed by diodes having their respective anodes on the side of the first inductive element, an additional diode being connected in parallel on this inductive element.

The foregoing objects, features, and advantages of the present invention will be discussed in detail in the following non-limiting description of specific embodiments in connection with the accompanying drawings.

DETAILED DESCRIPTION

Figure 1:
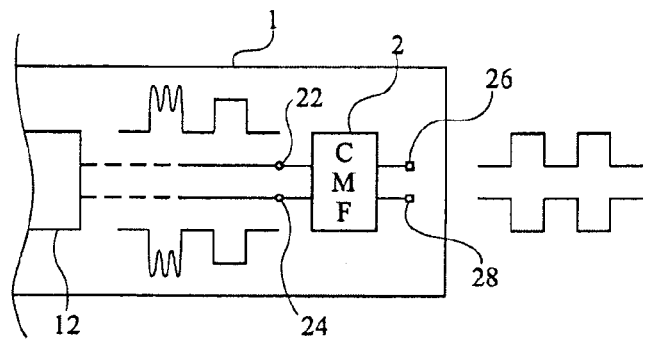
FIG. 1, previously described, shows an example of an electronic circuit of the type to which the present invention applies as an example.

The same elements have been designated with the same reference numerals in the different drawings. For clarity, only those elements which are useful to the understanding of the present invention have been shown and will be described. In particular, the circuits connected upstream or downstream of a common-mode filter have not been detailed, the present invention being compatible with usual applications of such common-mode filters.

A field to which the present invention more specifically applies is the use of common-mode filters in radiofrequency transmission systems. In particular, common-mode filters are widely used in mobile communication equipments of cell phone type and this, for several reasons.

A first reason is that the differential lines conveying the data are high-rate lines and can thus radiate signals in the different receive bands of the communication device. A common-mode filter is then used to filter receive bands of the phone by being generally placed at the output of the differential transmitter.

Another reason is that the phone antenna is generally of a power (for example, on the order of 2 watts for GSM phones) sufficient for its radiation to be captured by the lines conveying the high-rate signals in the electronic circuits. To avoid this, a common-mode filter is placed at the input of the differential receiver and filters the transmission frequency bands of the phone.

Another advantage of a common-mode filter is to avoid radiations in the case of a phase-shift (intrinsic or incidental) of the differential signals. Such phase-shifts may result from slight pattern differences of the conductive lines on integrated or printed circuits. Without any filter, the sensitivity and the reception of the phone are altered.

The use of magnetic material is particularly disturbing in such equipment, which is desired to be miniaturized at the lowest possible cost.

Figure 2:
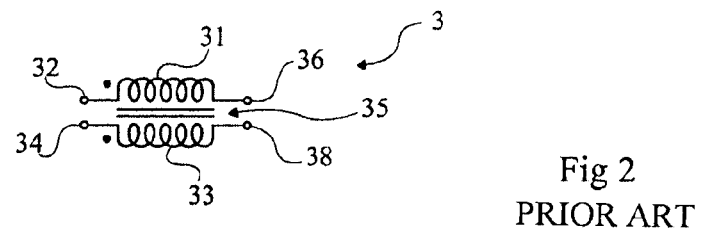
FIG. 2, previously described, shows a usual example of a common-mode filter.

To integrate or decrease the cost of a common-mode filter, it could be devised to eliminate the magnetic material of the example of FIG. 2 and to make the inductances in the form of planar windings in two superposed conductive levels (separated by an insulator). However, the maximum theoretical coupling then is one. The inductance values which should be provided would generate a bulk incompatible with the desired miniaturization of circuits and electronic devices. For example, to obtain a common-mode attenuation of approximately 20 dB at 900 MHz (GSM band), inductances of approximately 90 nH would be necessary. To obtain a low series resistance, this would take up an unrealistic surface area of several square millimeters or even centimeters.

Further, the series resistance of inductances of such values adversely affects the differential mode transmission. Further, the structure would also generate significant stray capacitances. Such differential mode impedance modifications are critical for links conveying digital signals, which are generally impedance-matched.

Figure 3:
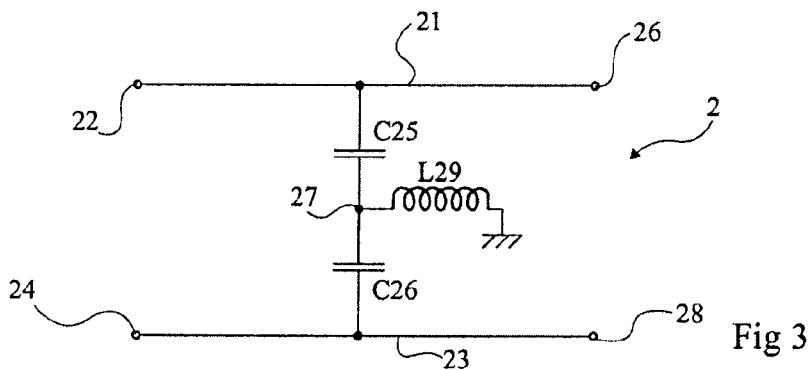
FIG. 3 shows an embodiment of a common-mode filter.

FIG. 3 shows an embodiment of a common-mode filter 2. According to this embodiment, input terminals 22 and 24 are directly connected to respective output terminals 26 and 28. "Directly" means with no interposed capacitive, inductive, or resistive elements other than the stray elements linked to the pattern of a conductive line or of a wire between these terminals.

To simplify the following description, reference is made to terminals or lines 21 and 23 respectively connecting terminals 22 and 26 to each other and terminals 24 and 28 to each other. In practice, it can also be considered that terminals 22 and 26 are common, as well as terminals 24 and 28.

Lines or terminals 21 and 23 intended to convey the differential signal are, according to this embodiment, connected by two capacitive elements C25 and C26 of same value, in series, and their junction point 27 is grounded by an inductive element L29.

The operation is the following: when signals in phase opposition are presented on terminals 22 and 24, the voltage difference between terminals 21 and 23 is zero. Accordingly, the voltage at midpoint 27 is also zero and no current flows through inductance L29. However, in the presence of signals (more exactly of a component) in phase (typically, noise occurring on the two differential signals) on terminals 22 and 24, the voltage difference between terminals 21 and 23 is no longer zero. Inductance L29 then drains off the signal present at node 27 towards the ground.

Thus, functionally, filter 2 drains off the common-mode noise towards the ground instead of exhibiting a high series impedance between the input/output terminals.

The embodiment of FIG. 3 thus reduces the series impedance for the differential-mode signals.

Figure 4:
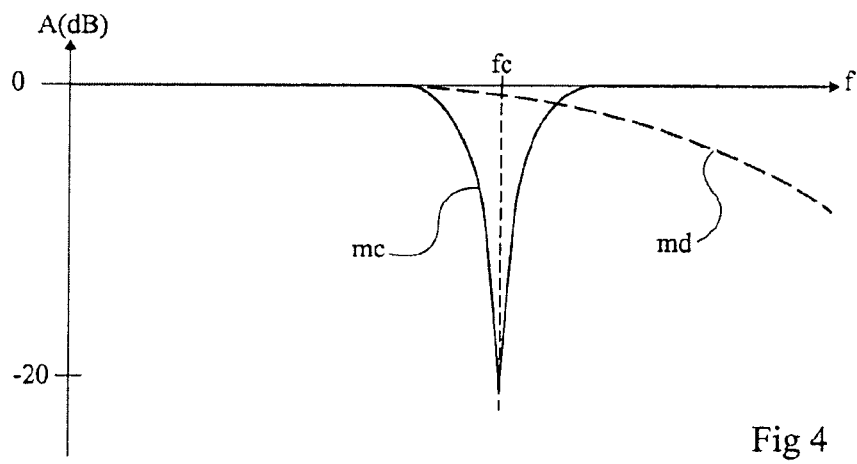
FIG. 4 illustrates the frequency response of the filter of FIG. 3.

FIG. 4 illustrates an example of a frequency response of the filter of FIG. 3.

This filter behaves, for the common-mode signals (curve mc in full line), as a band-stop filter centered on a resonance or cut-off frequency fc equal to:

$$\frac{1}{2\pi\sqrt{L29*(C25+C26)}}.$$

It should be reminded that the respective values of capacitive elements C25 and C26 are equal to respect the symmetry of the two lines. Further, it is considered that the capacitive and inductive elements have a negligible series resistance. Further, this series resistance is not disturbing since it does not attenuate the signal between the input and output terminals.

The differential-mode signals (curve and in dotted lines) are only attenuated for much higher frequencies. The attenuation is essentially due to capacitances C25 and C26 which have a relatively low value to obtain a wide bandwidth in differential mode.

In the example of FIG. 4, an attenuation A of 20 dB at the cut-off frequency has been arbitrarily indicated.

As a specific embodiment, a filter such as illustrated in FIG. 3 formed with capacitive elements C25 and C26 of approximately 3 picofarads and an inductive element L29 of approximately 4.65 nanohenries has a cut-off frequency around 950 MHz with an attenuation of more than 20 dB, and provides an attenuation greater than 10 dB between 880 MHz and 1.3 GHz. The differential bandwidth is 2 GHz (attenuation lower than 3 dB).

The fact of only filtering a narrow band in common mode is not disturbing since common-mode noise perturbations capable of interfering with differential-mode signals are in the cell phone operation frequency band, assumed in this specific embodiment to be the GSM band.

More generally, advantage is taken from the fact that, in many applications, the common mode which is desired to be filtered corresponds to an identified frequency band, that is, the operating bandwidth of the device, for example, multi-band cell phones (GSM, DCS, PCS, WCDMA).

Figure 5:
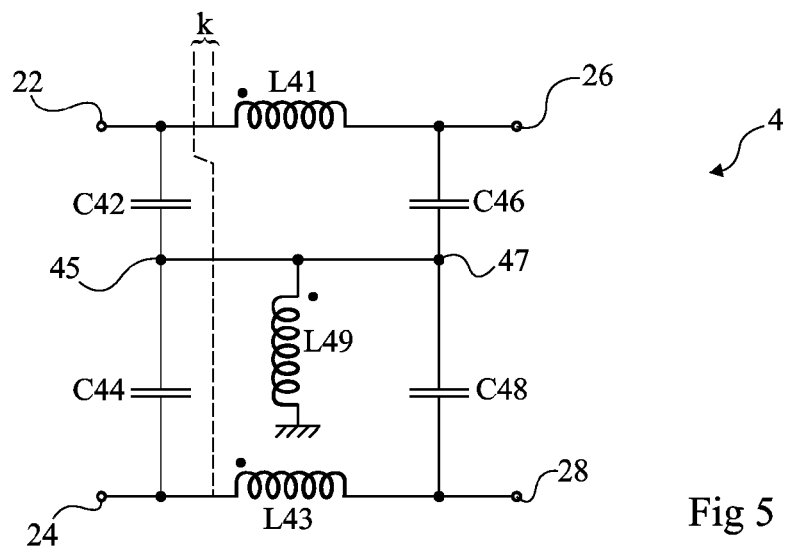
FIG. 5 shows another embodiment of a common-mode filter.

FIG. 5 shows another embodiment of a common-mode filter.

Input terminals 22 and 24 are connected by two capacitive elements C42 and C44 in series. Output terminals 26 and 28 are connected by two capacitive elements C46 and C48 in series. The respective midpoints 45 and 47 of these series associations are interconnected and grounded by a first inductive element L49. Terminals 22 and 26 are connected by an inductive element L41 while terminals 24 and 28 are connected by an inductive element L43.

The embodiment of FIG. 5 enables, for a given cut-off frequency, to decrease the values of the capacitive elements. Preferably, the four capacitive elements are of same value. As a variation, elements C42 and C44 are of same value and elements C46 and C48 are of same value.

Further, the presence of inductive elements L41 and L43 enables to widen the attenuation band of the common-mode filter. The phase points of elements L41 and L43 are on the same side to avoid filtering the differential mode. Elements L41 and L43 are of same value to keep the symmetry of the filter.

Figure 6:
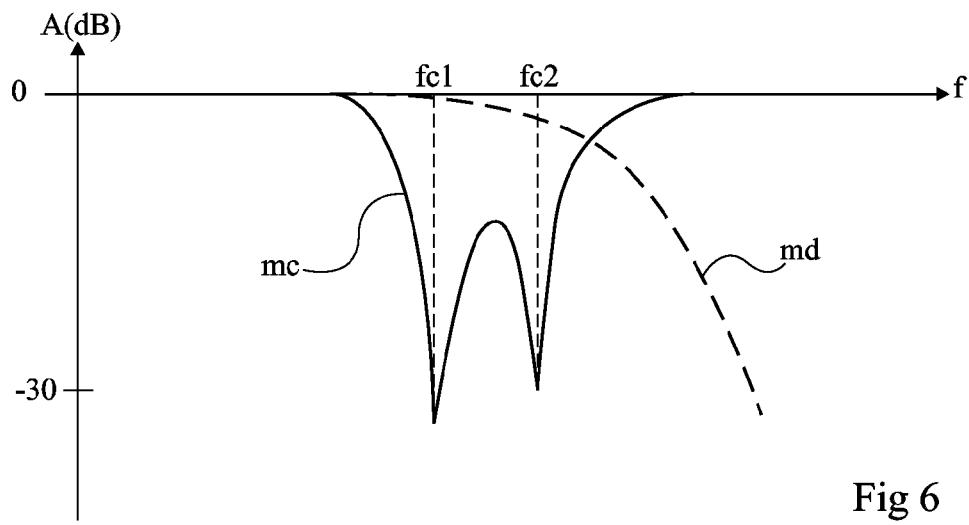
FIG. 6 illustrates the frequency response of the filter of FIG. 5.

FIG. 6 illustrates an example of a frequency response of the filter of FIG. 5. In common mode (curve mc in full line), the filter comprises a first cut-off frequency fc1 conditioned by elements C42, C44, and L49. Frequency fc1 is, as a first approximation:

$$\frac{1}{2\pi\sqrt{2*L49*(C42+C44)}}.$$

A second cut-off frequency fc2 is conditioned by elements L41, L43, C42, C44, C46, C48, and L49. As a first approximation, it can be considered that it only depends on elements L41, C42, and C46 (or L43, C44, and C48) and is equal to:

$$\frac{1}{2\pi\sqrt{\left(L41*\frac{C42*C46)}{C42+C46}\right)}}.$$

As a specific embodiment, a filter of the type in FIG. 5 has been formed with capacitive elements C42, C44, C46, and C48 of approximately 1.8 picofarads and with inductive elements L41, L43 of approximately 8 nanohenries and L49 of approximately 5.5 nanohenries. This filter exhibits, in common mode, an attenuation greater than 10 dB between approximately 800 MHz and 2 GHz, which enables to cover all the current bands of mobile telephony (GSM, DCS, WCDMA, GPS, etc.). The bandwidth in differential mode is on the order of 1.85 GHz. The bandwidth in differential mode is decreased with respect to the embodiment of FIG. 3 due to the capacitance increase.

To further decrease the size of the capacitive and inductive elements, inductances L41 and L43 may be coupled (with no magnetic material). Such a variation is illustrated by a dotted line in FIG. 5, to symbolize a coupling k.

In an integrated assembly, such a coupling may be obtained by giving elements L41 and L43 the form of interlaced or superposed planar conductive windings.

As a specific embodiment, a filter according to this variation has been formed with capacitive elements of approximately 750 femtofarads, inductive elements L41 and L43 of approximately 13 nanohenries coupled with a coupling coefficient on the order of 0.85 (necessarily smaller than 1 in the absence of a magnetic material), and with an inductance L49 of approximately 15 nanohenries. The frequency response of such a filter has an attenuation greater than 20 dB between 850 and 1.6 GHz and greater than 10 dB until approximately 2.25 GHz with a differential bandwidth ranging up to approximately 6 GHz.

Figure 7:
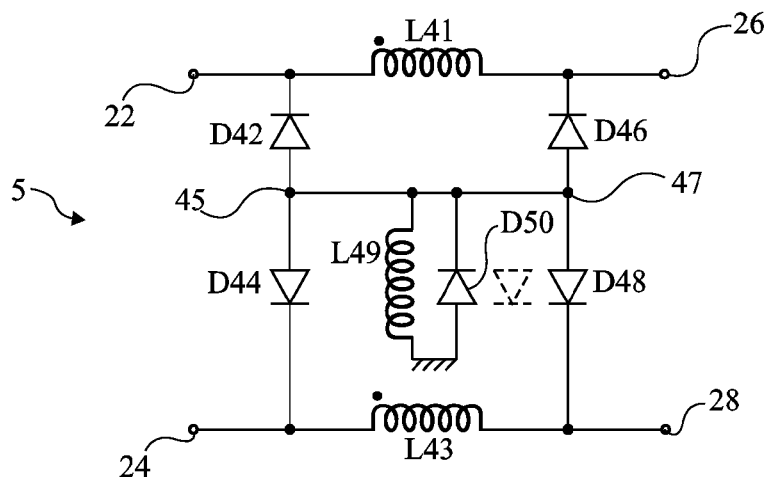
FIG. 7 shows another embodiment still of a common-mode filter, protected against possible electrostatic discharges.

FIG. 7 shows another embodiment still of a common-mode filter based on the structure of the filter of FIG. 5 and associated with elements of protection against electrostatic discharges (ESD). The obtaining of the ESD protection results from the replacement of capacitive elements C42, C46, C48, and C44 with diodes D42, D44, D46, and D48 having their respective anodes on the sides of midpoints 45 and 47. Further, an additional diode D50 is assembled in parallel on inductive element L49. As illustrated by the dotted line of FIG. 7, the orientation of diode D50 matters little. The function of this diode is to short-circuit the overvoltage that may be generated by inductive element L49 in case of an electrostatic discharge.

Replacing of the capacitive elements with diodes only slightly changes the filter response.

The described structures enable forming a common-mode filter without using magnetic materials while staying within reasonable inductance values from an integration viewpoint.

Different embodiments with various alternatives have been described. Various alterations and modifications will occur to those skilled in the art. It should be noted that those skilled in the art may combine various elements of these various embodiments and alternatives without showing any inventive step. In particular, the values to be given to the different components depend on the application and on the attenuation bands desired for the common mode. Further, the practical implementation of the present invention in the form of an integrated circuit on glass substrates or on substrates of another insulator are within the abilities of those skilled in the art based on the functional indications given hereabove and on the constraints imposed by the technology used. Further, although the described embodiments specifically apply to an integrated implementation, they may also be formed on a printed circuit.

Further, although embodiments in which the same inductive element connects each capacitive element to the input and output terminals have been described, separate inductive elements of same values may be provided at the cost of a more significant bulk.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A common-mode filter comprising first and second input terminals and first and second output terminals and a first inductive element, wherein the first input terminal is connected to the first output terminal by a second inductive element and the second input terminal is connected to the second output terminal by a third inductive element, and wherein:

the first and second input terminals are connected by first and second capacitive elements in series; and the first and second output terminals are connected by third and fourth capacitive elements in series, midpoints of the respective series connections of the capacitive elements being interconnected to a common node and to a first terminal of the first inductive element, the other terminal of which is grounded, wherein the first, second, third and fourth capacitive elements and the first inductive element are directly connected to the common node.

2. The filter of claim 1, wherein the second and third inductive elements are coupled.

3. The filter of claim 1, wherein the first, second, third, and fourth capacitive elements are formed by diodes having their respective anodes on a side of the first inductive element, an additional diode being connected in parallel on the first inductive element.

4. A common-mode filter comprising:
first and second input terminals;
first and second output terminals;
first and second capacitive elements respectively coupled between each of the first and second input terminals and a common node;
third and fourth capacitive elements respectively coupled between each of the first and second output terminals and the common node;
a first inductive element coupled between the common node and a reference voltage;
a second inductive element coupled between the first input terminal and the first output terminal; and
a third inductive element coupled between the second input terminal and the second output terminal, wherein the first, second, third and fourth capacitive elements and the first inductive element are directly connected to the common node.

5. A common-mode filter as defined in claim 4, wherein the second inductive element is inductively coupled to the third inductive element without the use of magnetic material.

6. A common-mode filter as defined in claim 4, wherein the reference voltage is ground.

7. A common-mode filter as defined in claim 4, wherein the first, second, third and fourth capacitive elements are implemented as diodes having anodes connected to the common node.

8. A common-mode filter as defined in claim 7, further comprising an additional diode connected between the common node and the reference voltage.

9. A common-mode filter as defined in claim 4, wherein the first, second, third and fourth capacitive elements have equal values.

10. A common-mode filter as defined in claim 4, wherein the first and second capacitive elements have equal values and wherein the third and fourth capacitive elements have equal values.

11. A method for common-mode filtering using a common-mode filter having first and second input terminals and first and second output terminals, comprising:
providing first and second capacitive elements respectively coupled between each of the first and second input terminals and a common node;
providing a first inductive element coupled between the common node and a reference voltage;
providing third and fourth capacitive elements respectively coupled between each of the first and second output terminals and the common node;
providing a second inductive element coupled between the first input terminal and the first output terminal; and
providing a third inductive element coupled between the second input terminal and the second output terminal, wherein the first, second, third and fourth capacitive elements and the first inductive element are directly connected to the common node.

12. A method as defined in claim 11, wherein the provided first, second, third and fourth capacitive elements are diodes.

13. A method as defined in claim 12, further comprising providing a diode coupled in parallel with the first inductive element between the common node and the reference voltage.

* * * * *